(12) United States Patent
Radic

(10) Patent No.: US 10,788,520 B2
(45) Date of Patent: Sep. 29, 2020

(54) SUB-NOISE DETECTION OF A FAST RANDOM EVENT

(71) Applicant: Stojan Radic, San Diego, CA (US)

(72) Inventor: Stojan Radic, San Diego, CA (US)

(*) Notice: Subject to any disclaimer, the term of this patent is extended or adjusted under 35 U.S.C. 154(b) by 1015 days.

(21) Appl. No.: 15/298,588

(22) Filed: Oct. 20, 2016

(65) Prior Publication Data

US 2017/0115333 A1 Apr. 27, 2017

Related U.S. Application Data

(60) Provisional application No. 62/244,499, filed on Oct. 21, 2015.

(51) Int. Cl.
*G01R 23/20* (2006.01)
*G01R 23/165* (2006.01)
*G01N 22/00* (2006.01)

(52) U.S. Cl.
CPC ........... *G01R 23/20* (2013.01); *G01R 23/165* (2013.01)

(58) Field of Classification Search
CPC .............................. G01R 23/20; G01R 23/165
See application file for complete search history.

(56) References Cited

U.S. PATENT DOCUMENTS

| | | | |
|---|---|---|---|
| 7,103,214 B2 | 9/2006 | Kusakabe et al. | |
| 7,177,463 B2 | 2/2007 | Kusakabe et al. | |
| 7,433,538 B2 | 10/2008 | Kusakabe et al. | |
| 7,634,153 B2 | 12/2009 | Miyake et al. | |
| 8,674,868 B2 | 3/2014 | Vigoda et al. | |
| 9,071,261 B2 | 6/2015 | Shen et al. | |
| 9,344,310 B2 * | 5/2016 | Lee | H04L 27/12 |
| 9,992,048 B2 * | 6/2018 | Hu | H04B 1/69 |
| 10,069,522 B2 * | 9/2018 | Terry | H04L 27/2614 |
| 10,263,635 B2 * | 4/2019 | Nikitin | H03M 3/368 |
| 10,404,268 B2 * | 9/2019 | Nikitin | H03H 21/0001 |
| 10,637,490 B2 * | 4/2020 | Nikitin | H03M 3/458 |
| 2006/0068405 A1 * | 3/2006 | Diber | A61P 35/00 435/6.14 |

(Continued)

OTHER PUBLICATIONS

Gardner et al., Cyclostationarity: Half a century of research (Year: 2005).*

*Primary Examiner* — Mohammad K Islam
(74) *Attorney, Agent, or Firm* — Ditthavong & Steiner, P.C.

(57) ABSTRACT

Observation of random, non-repetitive phenomena is of critical importance in astronomy, spectroscopy, biology and remote sensing. Heralded by weak signals, hidden in noise, they pose basic detection challenges. In contrast to repetitive waveforms, a single-instance signal cannot be separated from noise by averaging. The present invention demonstrates that a fast, randomly occurring event can be detected and extracted from a noisy background without conventional averaging. An isolated 80-ps pulse was received with confidence level exceeding 99%, even when accompanied by noise. The detector employed in the present invention relies on instantaneous spectral cloning and a single-step, coherent field processor. The ability to extract fast, sub-noise events is expected to increase detection sensitivity in multiple disciplines. Additionally, the new spectral-cloning receiver can potentially intercept communication signals that are presently considered secure.

29 Claims, 10 Drawing Sheets

(56) References Cited

U.S. PATENT DOCUMENTS

2006/0291868 A1* 12/2006 Yee .................. H04B 10/50
  398/152
2008/0273638 A1    11/2008 Singh et al.
2011/0069309 A1*  3/2011 Newbury ............ G01J 3/453
  356/326

* cited by examiner

SUB-NOISE DETECTION OF A FAST RANDOM EVENT

CROSS-REFERENCE TO RELATED APPLICATION

This application claims the benefit of U.S. Provisional Application Ser. No. 62/244,499 by S. Radic, entitled "Sub-Noise Detection of a Fast Random Event," and filed on Oct. 21, 2015, the contents of which are incorporated herein in their entirety by this reference.

FIELD OF THE INVENTION

This application is directed to methods for sub-noise detection of a fast random event to detect and analyze signals associated with random and non-repetitive phenomena in noisy environments. Such methods are particularly relevant in areas such as communication, astronomy, spectroscopy, biology, and remote sensing.

BACKGROUND OF THE INVENTION

The spontaneous decay of a molecule (1), a fast radio-astronomy burst (2) or the arrival of a secure communication packet (3) are examples of non-repetitive events that pose similar challenges for observers. In addition to requiring a fast and sensitive detector, a randomly occurring signal must be extracted from the background noise in either the optical or electrical domain. If the event is repetitive, this noise can be substantially eliminated by classical averaging (4). When noise is temporally uncorrelated, the summation of a sufficiently large number of signal instances can lead to an arbitrary signal-to-noise ratio (4) (SNR) improvement. Simple to implement, averaging plays a critical role in the capture of fast, weak or noisy signals. A powerful generalization of the averaging concept was developed for cyclostationary signals accompanied by spectrally uncorrelated noise (5). In contrast to temporal averaging, cyclostationary and cumulant analysis recognizes that noise spectral components can be rejected if the signal is cyclically modulated. Intuitively, a similar treatment could be extended to a single-instance signal if it can be temporally replicated. In earlier work (6), a recirculating loop was used to create multiple, serialized signal outputs that can be independently detected and subsequently averaged. Such replication requires an amplifier to overcome coupling losses, thus injecting excess (amplification) noise as a result of the operation of the amplifier itself. Unfortunately, all known temporal replication mechanisms (6-7) are inherently lossy and are subject to this basic limitation.

Therefore, there is a need for an improved method for detecting and analyzing random, single-occurrence signals that occur at unpredictable intervals in a relatively noisy environment.

SUMMARY OF THE INVENTION

An improved method for detecting and analyzing random, single-occurrence signals that occur at unpredictable intervals in a relatively noisy environment is described. Methods according to the present invention have application in areas such as astronomy, spectroscopy, biology, communication, and remote sensing.

Accordingly, in general, a method according to the present invention is a method for analyzing and detecting random, single-occurrence signals that occur at unpredictable intervals in a relatively noisy environment by replicating a single event to frequency non-degenerate copies (spectral clones) in a nearly noiseless manner. Typically, an estimate of the single-occurrence signal is reached by coherent summation. Typically, a signal is distinguished from noise by determining that the noise does not have a deterministic relation. The signal can be associated with a sub-nanosecond event. Typically, sensitivity increases with spectral clone count, and a number of possible spectral clone counts, including, but not limited to, spectral clone counts of 6, 12, 24, or 36, can be used. In practice, the spectral clone count is defined by the number of frequency comb tones used in the receiver and the bandwidth of the subrate receiver element. Present frequency combs provide tone count in excess of 1000, enabling spectral count to reach at least 1000 copies; the cloning count can be a cloning count up to 1000. In one alternative, spectral decomposition and coherent summation can be achieved across partial bandwidth. When spectral decomposition and coherent summation is achieved across partial bandwidth, typically, a rectification step is employed prior to imposing band limitation and subsequent summation. Typically, the rectification step is performed by use of an optical modulator, such as a biased Mach-Zehnder modulator, that leads to electrical-to-rectified-optical-field conversion.

In a method according to the present invention, the signal can be selected from a signal generated in astronomy, a signal generated in spectroscopy, a signal generated in biology, a signal generated in communication, and a signal generated in remote sensing. However, signals from other sources that are of low or variable amplitude and that arise in a noisy environment can be detected and analyzed by methods according to the present invention. When the signal is a signal generated in biology, the signal can be associated with a subcellular process. The subcellular process can be a process such as metabolism, apoptosis, or cell division. Typically, the confidence level of the detection and analysis exceeds 50%. The confidence level of the detection and analysis can exceed 99%. In one alternative of a method according to this invention, a signal discrete Fourier transform is obtained in a computation-free manner.

In one alternative, the replication is performed to enable cyclostationary detection of the noisy signal. Typically, in this alternative, the method employs a set of lossless narrow filters with bandwidth of can be constructed over the full span of a Δf-wide signal and the spectral decomposition of a received field is analyzed by short-time Fourier transform to generate a phasor sum, wherein the differential phasor rotation is stopped by frequency shifting each output to the baseband. Typically, when such a set of lossless narrow filters is used, the spectral decomposition process is distortionless and lossless.

When the signal is associated with a sub-nanosecond event, typically, the received signal is mapped onto widely separated frequency carriers and then spectral decomposition is performed by a strictly periodic bandpass process. In this alternative, typically, analysis occurs in the optical domain, and typically, the received signal is in a microwave spectral range of from about 0.3 GHz to about 100 GHz. In this alternative, the received field is mapped onto a highly-coherent frequency comb. The frequency comb is typically tunable. In this alternative, typically, the detector bandwidth and the comb frequency offset are matched, and two wavelength demultiplexing elements (WDM) are used to route the spectrally overlapping copy and a local oscillator (LO) mode to two coherent detectors. Typically, in this alternative, the output of each detector D is sampled and used to perform coherent summation to discriminate the pulse from the noise. In this alternative, the tunable optical frequency comb can be generated by a method selected from the group consisting of use of mode locking lasers, cascaded four wave mixing (FWM) processes in a micro resonator cavity, and an optical cavity-less technique relying on optical pulses defined by a tunable microwave oscillation. Typically, in this alternative, phase locking between corresponding spectral lines of two combs is achieved by using a single frequency-stabilized master laser that seeds both tunable optical combs (TOCs) and phase locking.

BRIEF DESCRIPTION OF THE DRAWINGS

The following invention will become better understood with reference to the specification, appended claims, and accompanying drawings, where:

DETAILED DESCRIPTION OF THE INVENTION

Figure 1:
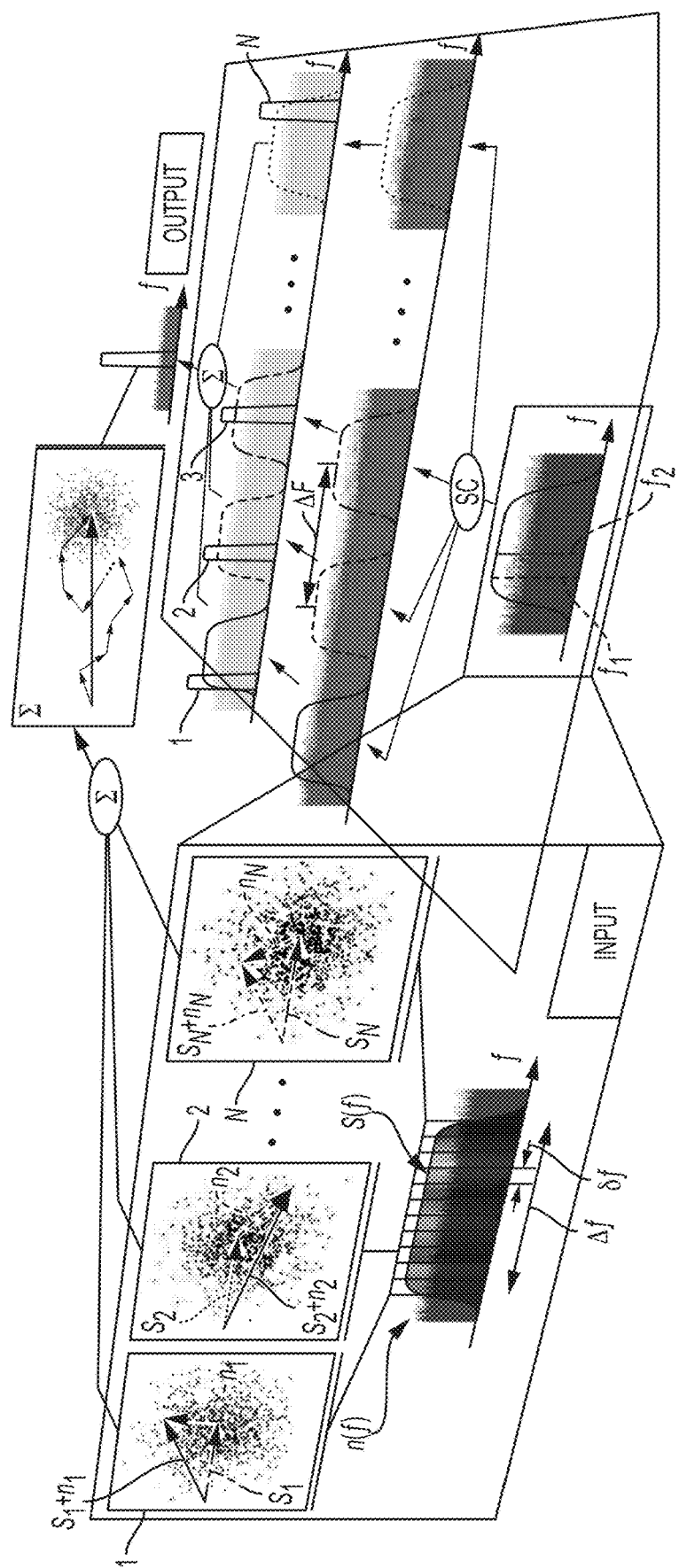
FIG. 1 is a schematic showing single-event noise discrimination. A set of lossless bandpass filters ($\delta f$) spectrally decomposes the signal and noise fields into a set of $S_k$ and $n_k$ phasors. In the reference frame of the signal carrier, these phasors are not synchronous and rotate at different rates $\omega=2\pi f_k$ (k=1,N); Spectral cloning (SC) maps the received field onto a widely-spaced grid ($\Delta F$) and enables lossless spectral decomposition by a single periodic process (filter). To coherently sum signal (noise) phasors, differential phasor rotation must be arrested by a frequency-invariant baseband process.

An improved method for detecting and analyzing random, sparsely occurring signals that occur at unpredictable intervals in a relatively noisy environment is described. Methods according to the present invention have application in areas such as astronomy, spectroscopy, biology, communication, and remote sensing.

Observation of random, non-repetitive phenomena is of critical importance in astronomy, spectroscopy, biology, communication, and remote sensing. Heralded by weak signals, hidden in noise, they pose basic detection challenges. In contrast to repetitive waveforms, a single-instance signal cannot be separated from noise by averaging. The present invention demonstrates that a fast, randomly occurring event can be detected and extracted from a noisy background without conventional averaging. An isolated 80-ps pulse was received with confidence level exceeding 99%, even when accompanied by noise. The detector employed in the present invention relies on instantaneous spectral cloning and a single-step, coherent field processor. The ability to extract fast, sub-noise events is expected to increase detection sensitivity in multiple disciplines. Additionally, the new spectral-cloning receiver can potentially intercept communication signals that are presently considered secure.

We have demonstrated that, despite the obstacles involved in detection and analysis of such signals, a single event can be replicated to frequency non-degenerate copies (spectral clones) in a nearly noiseless manner (8). We show that an isolated pulse can be extracted from noise by single-step processing of its spectral clones. To demonstrate single-event detection, an 80 ps long pulse was cloned and processed to increase the received signal-to-noise ratio (SNR) by 14.1 dB. To separate signal from noise, the experiment varied the number of spectral copies from 6 to 36, proving that background rejection can be progressively increased even when the random event is immersed in a high level of background noise.

When a repetitive signal s(t) is accompanied by noise n(t), its estimate can be reached by coherent summation (4):

$$\sum_{k=1}^{N} \frac{1}{N\Delta T} \int_{t_k-\Delta T/2}^{t_k+\Delta T/2} (s(t)+n(t))\,dt,$$

where $t_k$ and $\Delta T$ indicate the signal instance and observation (detection) interval, respectively. For a sufficiently large occurrence count (N>>1), when noise is a zero-mean uncorrelated process (4), this estimate can be arbitrarily accurate since $$\sum_{k=1}^{N} \frac{1}{N\Delta T} \int_{t_k-\Delta T/2}^{t_k+\Delta T/2} n(t)\,dt \to 0.$$

The In the case of a single event (N=1), noise cannot be repeatedly measured, but can still be discriminated from the signal in the spectral domain. Indeed, whereas two distinct signal spectral components have a deterministic relation, the same is not true for noise components; the deterministic relation is absent for noise components. This important difference was recognized (5) and used to discriminate delta-correlated noise from the signal. In the simplest cyclostationary receiver implementation, the product of two spectral components is integrated over many signal cycles to acquire the correlation between any pair of spectral components. The correlation collapses when only noise is received, thus allowing for signal feature extraction (5). Therefore, the signal can be distinguished from noise by this method.

Cyclostationary detection fails to reject the noise accompanying an isolated (single-cycle) event since no correlation can be drawn at any time instance beyond the event duration. However, by replicating such a signal in a substantially noiseless manner, one can still exploit the fact that the signal possesses spectral correlation while the received noise does not (FIG. 1). To describe noise discrimination in this case, let us assume that a set of lossless narrow filters with bandwidth $\delta f$ can be constructed over the full span of a $\Delta f$-wide signal (FIG. 1); $\delta f$ is substantially smaller than $\Delta f$. The spectral decomposition (9) of the received field r(t)=s(t)+n(t) can be described by the short-time Fourier transform (STFT) $R(t, k\delta f) = \int_{-1/2\delta f}^{+1/2\delta f} w(t-\tau) r(\tau) e^{j2\pi k\delta f \tau} d\tau$, where $w(t)=\sin(\pi \delta f t)/\pi t$ is the $\delta f$-wide band-pass window function. STFT is a slowly varying complex function which, when sampled within the detection interval (9) [t±1/(2δf)], represents the received spectral component centered at $f_k$ as the phasor sum $R_k=S_k+n_k$. In the absence of noise, its magnitude is a measure of the signal spectral density $\tilde{S}(f_k)$; in the absence of the signal, the magnitude and phase of this phasor is defined by the statistics of the interfering noise field.

The STFT cannot be realized by mere filtering centered at $f_k$, since it will result in the carrier-specific phase rotation $2\pi f_k t$. To address this, the differential phasor rotation must be stopped by frequency shifting each output to the baseband (9). Consequently, phasor summation across the entire bandpass set leads to a noise-sensitive outcome. For a noiseless, transform-limited signal pulse, this summation results in collinear vector addition. In contrast, when only noise is present, this summation resembles a random walk in the complex plane, (inset $\Sigma$, FIG. 1). Consequently, the effective SNR increase provided by a spectrally cloning detector should scale with the replica count N (10) as $\sim(N/\sqrt{N})^2$.

Although the single-event detector is conceptually simple, its realization faces a set of basic challenges. In the most important of these challenges, the spectral decomposition process must be distortionless and lossless. This requirement is easily satisfied for slow, microsecond-scale events that can be quantized with high precision (11,12). In this case, the digitized field can be used to calculate the sampled STFT and emulate the coherent sub-band summation (FIG. 1). However, when the event is fast (sub-nanosecond), signal quantization imposes a fundamental resolution limit (11,12), eliminating such a computational approach. Its alternative, physical channelization (13), is neither distortionless nor lossless.

Figure 2:
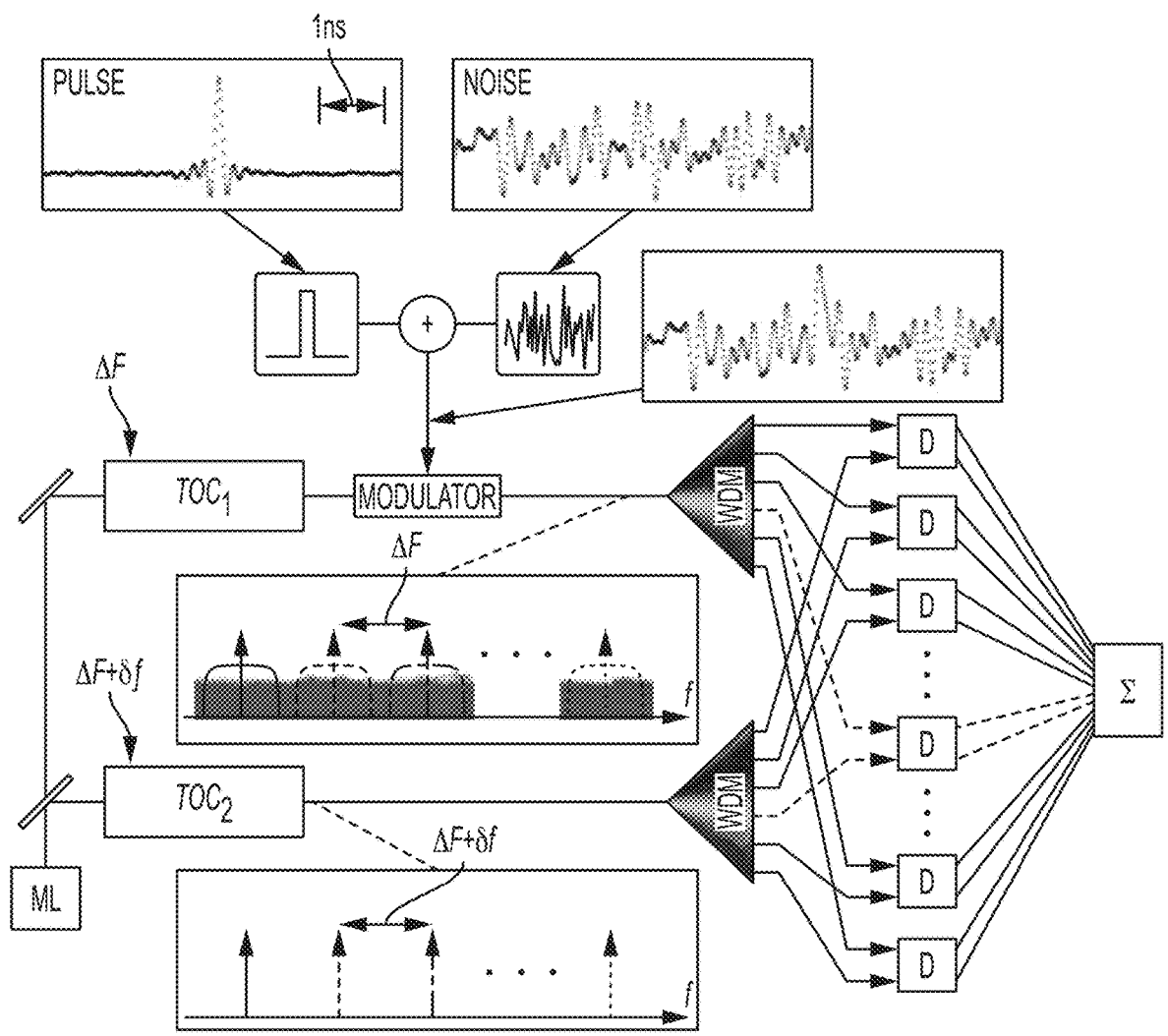
FIG. 2 is a schematic showing a spectral cloning receiver. Two frequency-tunable optical combs ($TOC_{1,2}$) are derived from a single master laser (ML). A single pulse is combined with noise and used to modulate $TOC_1$ with frequency pitch $\Delta F$. The Vernier comb $TOC_2$, with frequency pitch $\Delta F+\delta f$, serves as local oscillator array and is combined with the received signal at the subrate detector array (D).

Recognizing these limits, we map the received signal onto widely separated frequency carriers ($\Delta F$) and perform spectral decomposition by a strictly periodic bandpass process (FIG. 1). In the optical domain, the received spectrum can be parametrically cloned (8) and subsequently decomposed by a single physical filter (14). This strategy cannot be applied in spectral ranges where efficient, low noise parametric mixers (15-16) do not exist. Among those ranges, the microwave range (0.3-100 GHz) is arguably the most important since it hosts commercial (17), scientific (17) and defense (17,18) signals. To construct a single-event detector operating in this band, we map the received field onto a highly-coherent frequency comb (FIG. 2).

In the first experiment, a single-instance signal was represented by a 12 GHz-wide pulse and was cloned to six spectral replicas. The pulse was centered at 6.5 GHz and combined with broadband noise generated by a photodiode receiving amplified spontaneous emission from an erbium-doped fiber amplifier. The signal and noise were combined, and used to modulate a tunable optical frequency comb ($TOC_1$), thereby replicating the noise-loaded signal onto its frequency modes. Each mode had an optical SNR in excess of 40 dB, measured within a 12.5 GHz-bandwidth and at 1550 nm. $TOC_1$ had a continuously-variable frequency pitch (19) that was set to $\Delta F=50$ GHz. The second (Vernier) optical comb ($TOC_2$) was used as a local-oscillator (LO) array with frequency pitch differing by $\delta f=2$ GHz from the signal comb. Both optical combs were seeded by a single master oscillator with spectral linewidth of 3 kHz, guaranteeing a high degree of mutual coherence (20) during the longest signal capture time (~256 μs). The ability to continuously tune the frequency pitch of both optical combs is critical, as it defines the offset between a specific spectral replica and the unique LO mode. When combined in a detector with bandwidth $\delta f_D$, the beating between the $k^{th}$ replica and the LO mode selects a $\delta f_D$-wide spectral segment that is centered $f_k=k \times \delta f$ away from the replica carrier. If the detector bandwidth and the comb frequency offset are matched ($\delta f_D=\delta f$), the comb-assisted cloning becomes equivalent to the spectral decomposition (FIG. 1). Two wavelength demultiplexing elements (WDM) were used to route the spectrally overlapping copy and LO mode to a coherent detector (D). A matched detector bandwidth, defined by the ratio of the pulse bandwidth (f=12 GHz) and the spectral replica count N=6, defines the frequency offset between the signal ($TOC_1$) and Vernier combs ($TOC_2$), $\delta f=\Delta f/N=2$ GHz; this method employs two coherent detectors. Finally, the output of each detector D is sampled and used to perform coherent summation to discriminate the pulse from the noise, as detailed further below (21).

Figure 3:
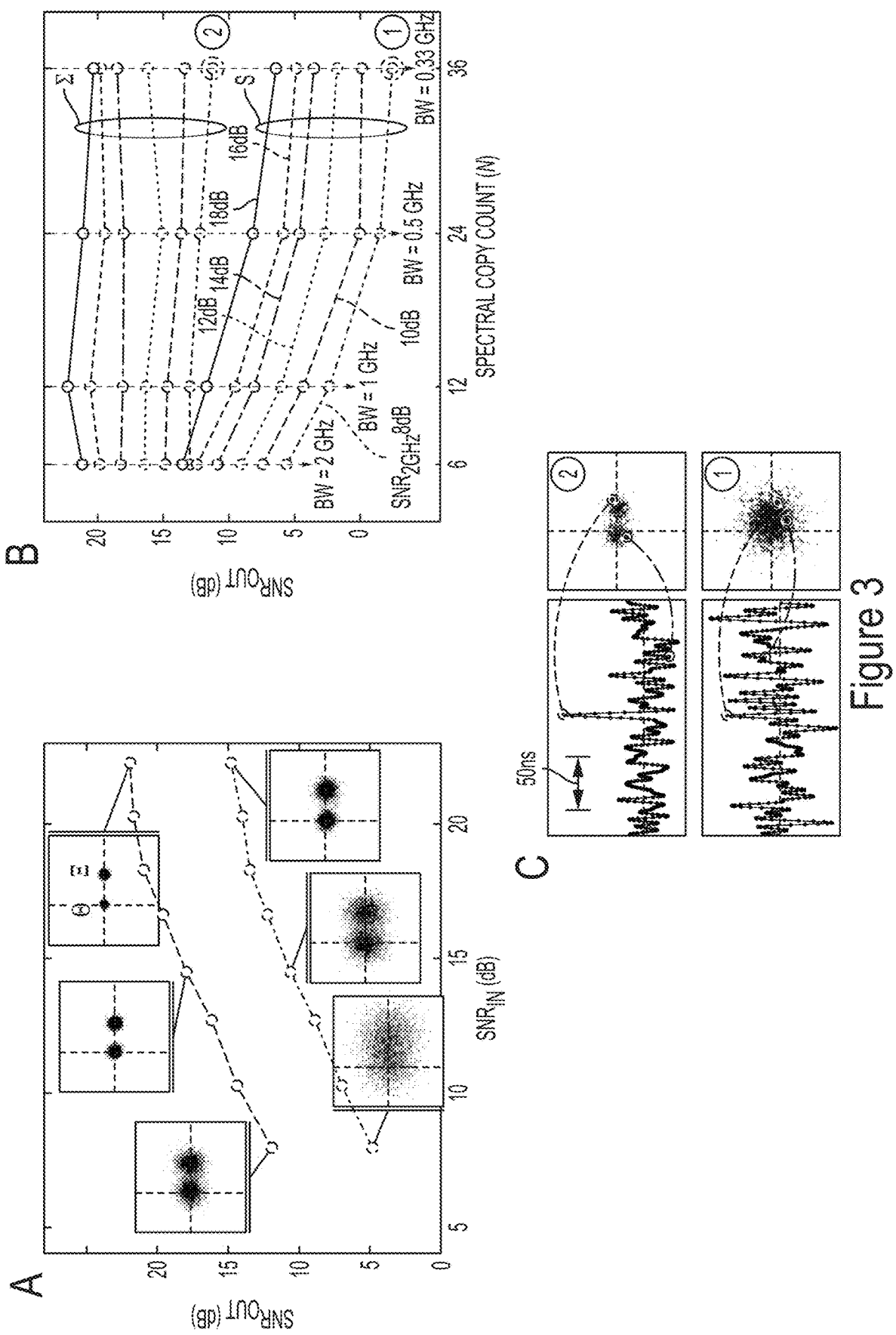
FIG. 3 is a schematic showing single pulse detection. In Panel (A), an 80 ps-pulse with varied noise level was detected by generating and processing 6 spectral replicas (red curve). The inset illustrates pulse presence ($\Xi$) and absence ($\Theta$). The blue curve indicates the performance of an ordinary receiver. In Panel (B), sensitivity scaling is shown. Sensitivity Scaling. Spectral replica count was varied to perform 6-, 12-, 24- and 36-copy detection. Curve family $\Sigma$ corresponds to coherently summed replicas; S is conventional detection; the corresponding receiver's bandwidth (BW) is shown for each spectral copy count. In Panel (C), time reconstructed and scatterplot of the detected random pulse by (1) conventional and (2) 36 coherently summed replicas are shown.

The first measurement generated six spectral copies of an 80 ps pulse accompanied by various levels of interfering noise (FIG. 3a). The input SNR ($SNR_{IN}$) was defined as the ratio of the signal and noise powers, measured within the observation interval $N/\delta f=500$ ps. 4720 detections were performed to quantify the ability to distinguish signal from noise. Measurements (FIG. 3a) are shown with each point in the scatter plot corresponding to a single detection outcome. Intuitively, the detection of a low-noise pulse corresponds to highly distinguishable ensemble scatters. As an example, the measurement ensemble $\Xi$ (FIG. 3a) corresponds to the detection of a signal with $SNR_{IN}=22.3$ dB, whereas in $\Theta$ the signal was absent. The less overlap between these scatters reflects a higher confidence level (22) with which one can differentiate between pulse presence and absence, as detailed further below (21). To quantify the spectral-cloning receiver performance, we define the output SNR ($SNR_{OUT}$) as the ratio between the square of the scatter mean separation and its variance. As an illustration, a pulse with $SNR_{IN}=7.9$ dB is detected with $SNR_{OUT}=11.9$ dB, indicating a 4 dB increase in the level of detection confidence. To compare the performance of the spectral cloning and conventional detector, coherent decomposition and summation was not performed in a subsequent set of measurements. Instead, the output of each detector was recorded and its average was plotted (FIG. 3a). We note that the increase in $SNR_{OUT}$ between the two cases varies from 7.1 dB ($SNR_{IN}=22.3$ dB) to 7.5 dB ($SNR_{IN}=18.3$ dB), in agreement with the value predicted previously for six (N=6) spectral replicas $(N/\sqrt{N})^2 \sim 7.8$ dB.

Finally, to test the main hypothesis which predicts that the sensitivity increases with spectral clone count, receivers with 12, 24 and 36 replicas were constructed. To circumvent the physical scaling of the sub-rate detector array, interfering noise was synthesized using a 64GS/s digital-to-analog-converter (DAC) and combined with a 12 GHz-wide pulse, as described in the Supplement (21). Clone-scaling measurements (FIG. 3b) indicate that an average sensitivity gain of 10.4, 13.1 and 14.1 dB was achieved when 12, 24 and 36 copies were generated, respectively. These measurements agree remarkably well with the predicted sensitivity gains $(N/\sqrt{N})^2 \sim 10.8$, 13.8 and 15.6 dB, when N=12, 24 and 36, respectively.

Materials and Methods

Tunable Optical Frequency Comb (TOC) Generation:

An optical frequency comb in the context of this work refers to coherent light emission consisting of multiple equidistant spectral tones that can be freely tuned. Several methods have been used for frequency comb generation and range from mode locking lasers (23,24) and cascaded four wave mixing (FWM) processes in a micro resonator cavity (25,26), to the optical cavity-less technique relying on optical pulses defined by a tunable microwave oscillation (27). Among these, the cavity-less technique, capable of generating a high number of spectral tones separated by an RF-range (>25 GHz) is of particular importance since it removes any tuning inhibition imposed by optical resonance.

Figure 4:
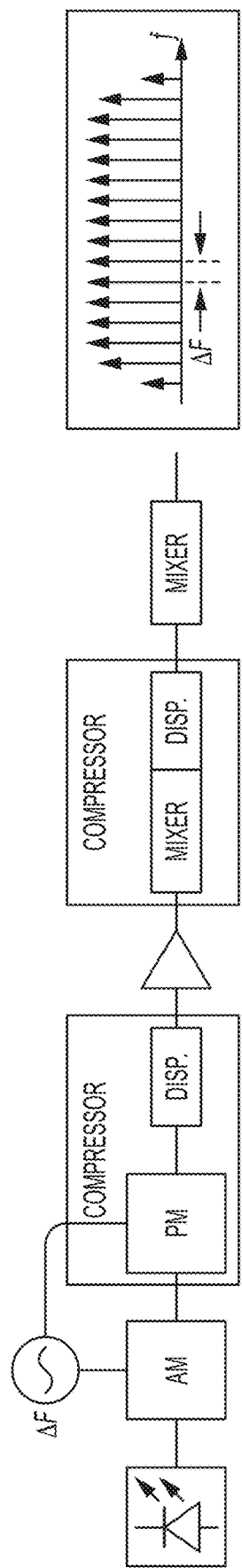
FIG. 4 shows tunable frequency comb generation architecture. The seed optical intensity pulses created by amplitude modulation (AM) of the CW laser are compressed in two successive compression stages (Compressor) to increase peak power prior to the efficient parametric comb generation in a parametric fiber mixer. PM-Phase Modulation; Disp.—Dispersive Stage.

The tunable optical frequency comb (TOC) was generated in stages (FIG. 4). In this topology, amplitude modulation of a single continues wave (CW) laser initiates the seed optical pulses required for TOC generation; these pulses are compressed and reshaped in two consecutive optical stages. Each compression stage incorporates phase modulation (PM), followed by a highly dispersive material. PM can be achieved by either a synchronous electro-optics phase modulator (first compressor in FIG. 4) or by taking advantage of the self-phase modulation (SPM) process in a nonlinear waveguide (the mixer in the second compressor of FIG. 4). Cascaded compression stages are designed to shorten the original seed pulse-width by approximately two orders of magnitude. Simultaneously, the same order of magnitude increase in the pulse peak power is achieved, preparing the condition of a highly efficient nonlinear interaction in the last mixing stage. The output of the comb generating device routinely achieves 12-THz wide emission that consists of 250 individual spectral lines spaced at 50 GHz, with overall spectral power variation below 3 dB. The spectral purity of the individual comb lines in terms of intensity and phase noise has been proven to closely approximate the original master laser (27).

Figure 5:
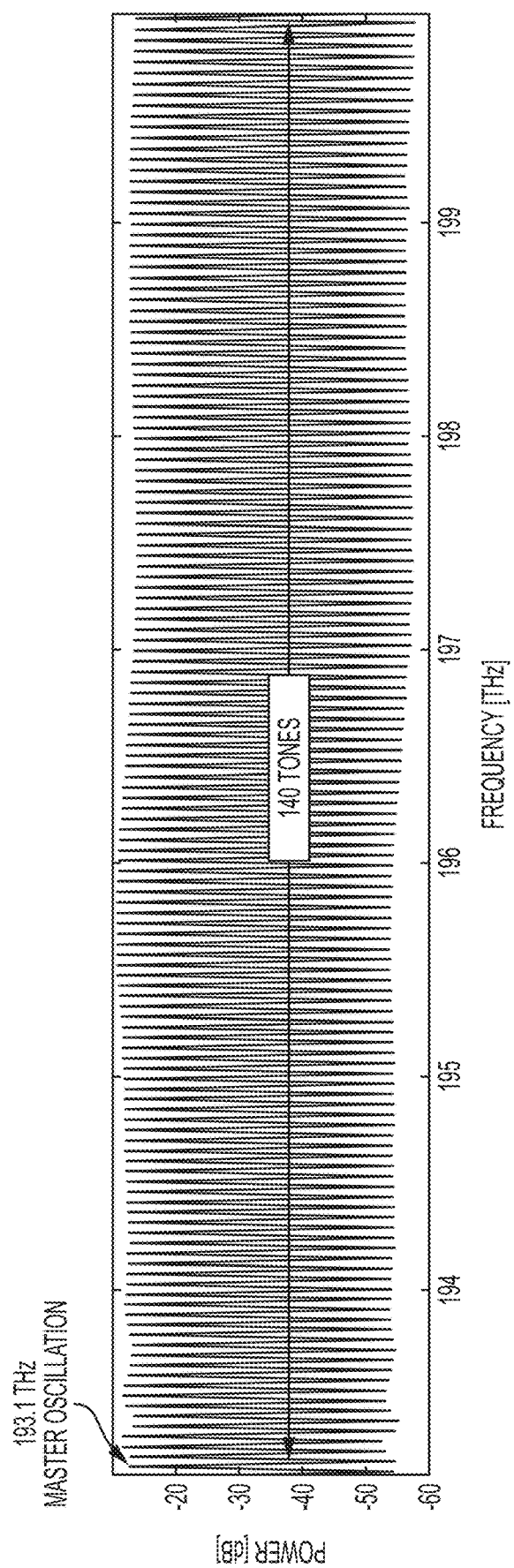
FIG. 5 shows an example of a captured optical spectrum. An example of the optical spectrum of the 50 GHz pitched comb captured by optical spectrum analyzer (OSA) at 0.1 nm resolution bandwidth (RBW) is shown. The specific capture illustrates only half of the generated comb spectrum. The generated emission is typically symmetric with respect to the master oscillator frequency (20).

Following the original architecture (FIG. 4), two separate TOCs for the signal and local-oscillator (LO) have been constructed: the two combs correspond to $TOC_{1,2}$ (FIG. 2). The frequency pitch of both combs can be precisely controlled to generate a frequency mismatch defined by the total number of spectral decomposition bins required for a given signal bandwidth. For instance, in the case of the 6 channel spectral decomposition architecture, the frequency pitch of the signal and LO comb were set at 50 and 48 GHz, respectively; an increased number of spectral copies is easily matched by decreasing the offset between two comb pitches. The example of the optical spectrum of the generated comb (FIG. 5) was captured by a commercial optical spectrum analyzer (OSA). Phase locking between corresponding spectral lines of two combs was achieved by using a single frequency-stabilized master laser that seeds both TOCs and phase locking between the two RF oscillators driving the E-O modulators.

Synthetic Pulse Generation and Detection Scheme:

To demonstrate the performance of the random event detector, the signal comb (i.e., $TOC_1$) was amplitude modulated by a signal to noise ratio (SNR) limited 80-ps wide raised cosine shaped (with 0.1 roll off factor) and up-converted to 6.5 GHz pulses. The electrical pulses were generated by a 64 GS/s and 8-bit resolution digital to analog converter (DAC).

Figure 6:
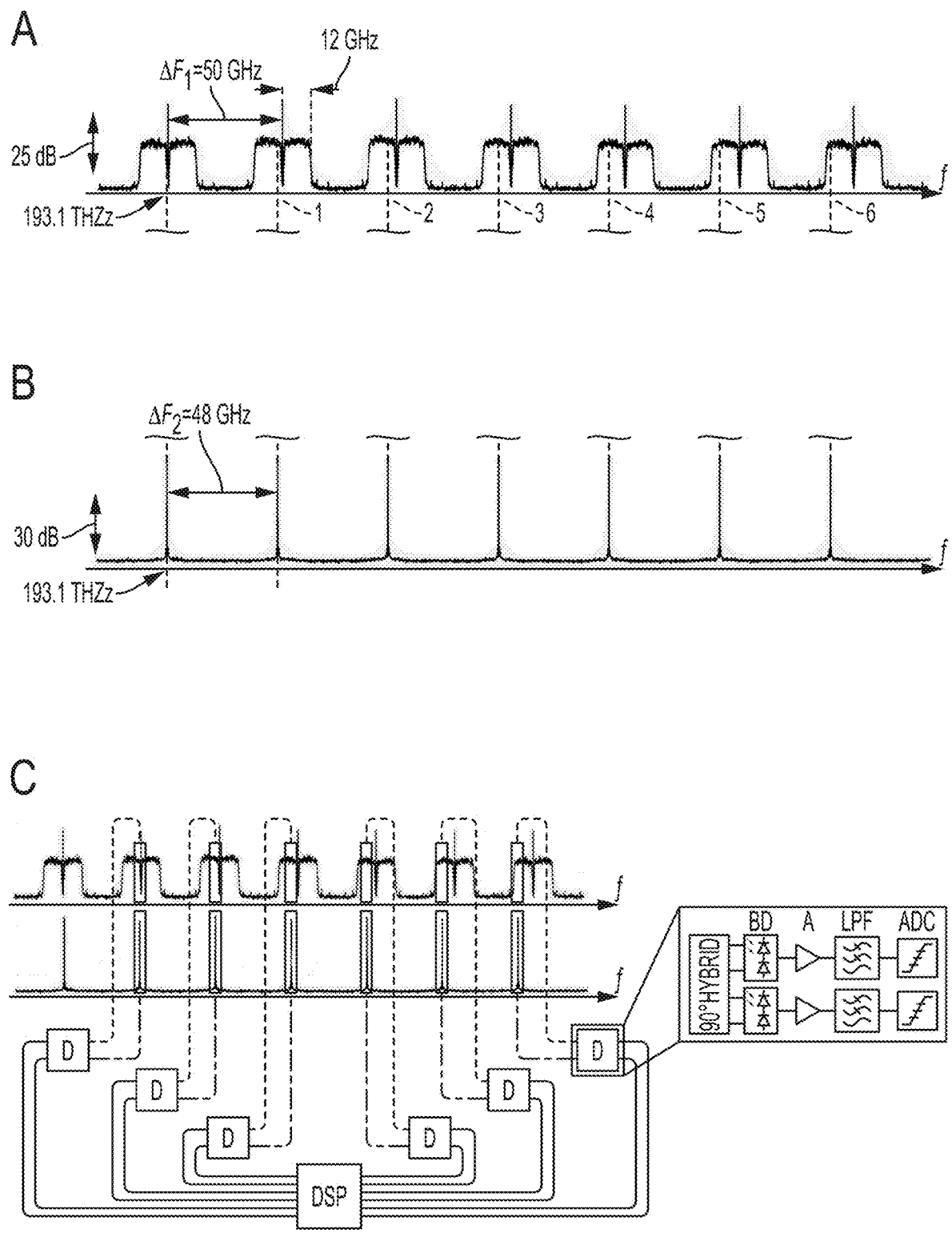
FIG. 6 shows detection architecture. The 6 channel spectral decomposition: High resolution (RBW=100 MHZ) capture of A. modulated signal comb; B. local oscillator (LO) comb. C. Coherent summation architecture. Each LO comb line and the spectrally overlapping part of the modulated signal with be detected by an individual coherent receiver. BD: balanced detector, A: amplifier, LPF: low pass filter, ADC: analog to digital converter, DSP: digital signal processing.

For 6-copy spectral decomposition experiment, the pulse repetition rate was set to 10 MHz and SNR varied by combining an RF pulse with electrical noise. The noise was generated using the detection of near-ideal white noise (optical amplified spontaneous emission from erbium-doped amplifier). The noise loaded pulse was imprinted on the optical field using an amplitude modulator biased at null-point. Relative frequency plans of the modulated signal comb and LO comb is compared in FIG. 6. A 48 GHz-pitched LO comb (i.e., $TOC_2$ in FIG. 6) was also generated using the tunable parametric structure (FIG. 4) and phase-locked to $TOC_1$. The modulated signal and LO combs were spectrally demultiplexed by two standard 50 GHz arrayed waveguide gratings (AWGs) and matched ports (indicated by the same color) were sent to six 90-degree hybrid elements connected to 12 balanced receivers. The output of each balanced detector was electrically amplified and physically extracted by 1 GHz anti-aliasing filters before being coupled into an array of 12 analog to digital converters (ADCs), operating at 2GS/s and 12-bit resolution (9 effective number of bits) (FIG. 6). At each sampling instance, the receiver plane generated 6 complex numbers (received quadratures) that correspond to 6 spectral phasors described in the main text of the manuscript. After the phase alignment (described further below), the sum of quadratures is observed by the sub-band receiver (bandwidth 2 GHz). The procedure is repeated 4720 times and, during half of these instances, 80 ps noise-loaded pulse is detected within 500 ps window; the pulse events were absent in the second half of the data set. Received events are represented by the signal and the noise clouds plotted in FIG. 3. The SNR of the processed signal (output SNR) was defined as the ratio of the squared signal-noise cloud separation and signal cloud variance.

When cloning count is increased beyond 6-count (i.e., 12, 24 and 36), the signal comb was modulated by the same pulse generator, at 100 MHz repetition rate. In this case, the electrical noise was injected in the digital domain and generated by the same DAC used to shape the pulse event. The noise was generated using a sequence of 256000 samples, synthesized by a random number generator, with zero-mean Gaussian distribution and specific variance matching the given SNR. The procedure allowed for repeatable measurement of real-time, random event capture with sequential utilization of a 6-receiver set. As an example, a 24-count cloning receiver was created by tuning the LO comb frequency pitch to 49.5 GHz, addressing 6 copies at a time (i.e., channels 1-6, 7-12, 13-18 and, 19-24).

Pulse Time of Arrival (TOA) Estimation:

Phase differences between two adjacent channels are characterized by a random, slow phase and deterministic linear variations. The former is a result of physical path length variations in the fiber; the latter is inherent to the random arrival time of the detected pulse. Random phase fluctuations due to the variation in the fiber path length are a slow process (kHz scale) and can be cancelled by multiple techniques (28,29). To track and remove these fluctuations, we used a short (500 ns) preamble sequence that was repeated periodically, on a scale (ms) that greatly exceeds either the pulse duration (80 ps) or observation time (~ns). Separately, phase variation inherent to the random TOA is predicted by processing the received signal. In practice, the spectral decomposition performed by the cloning receiver can be understood in terms of a discrete Fourier transform (DFT): pulse delay corresponds to phase rotation in complex plane. Consequently, the field was processed to unwrap the phase as a function of the channel number by linear regression method. The slope of this function indicates the absolute time of arrival of the isolated pulse event.

Figure 7:
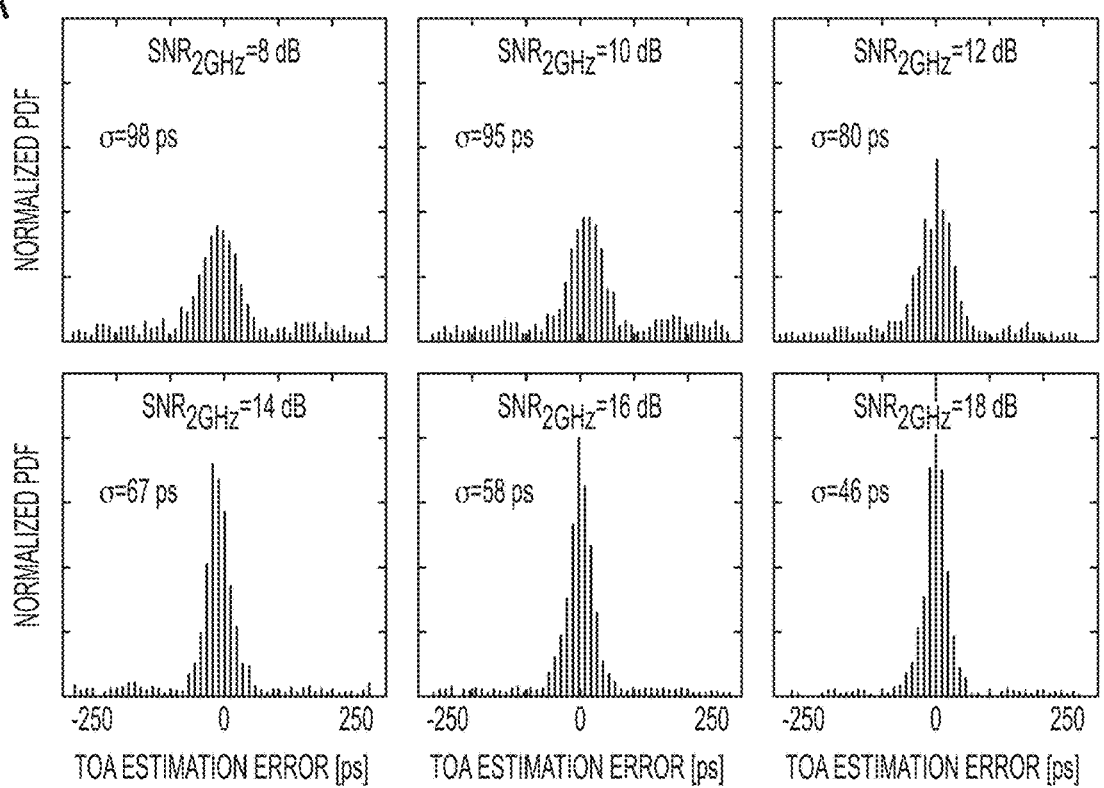
FIG. 7 shows time of arrival estimation error. Captured histograms of the time of arrival (TOA) estimation error for different input SNR cases for A. 6 and B. 12 channels spectral decomposition experiments. (The $\sigma$ is the statistical standard deviation which corresponds to the width of the main peak in all histograms).
Figure 7:
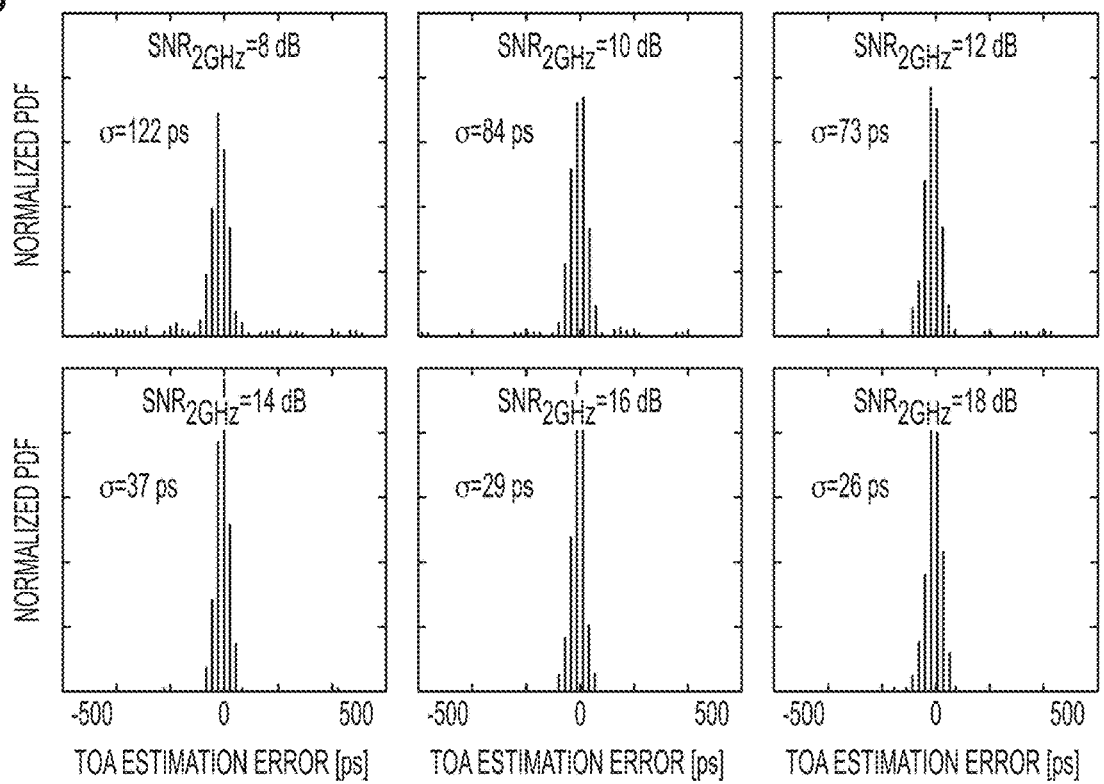

To evaluate the accuracy of the TOA phase estimation algorithm at different levels of input noise, a statistical test was performed by recovering TOA of 900 randomly delayed pulses. The histogram (FIG. 7) shows TOA estimation error for SNR varied at the input of the detector, in case of 6- and 12-count spectral cloning. Remarkably, even for the lowest SNR case, the observed deviation (TOA estimation error) is comparable to the pulse width. This also means that the ability to accurately align the spectral phasors and effectively reject the uncorrelated noise is not affected at low SNR levels. More importantly, while the description of the present application only discusses the detection of the event within the long temporal window, it is clear that the new receiver can accurately recover its exact time of arrival. The same strategy can also reconstruct the incoming event shape by noting that DFT, obtained in computation-free manner, can be used for this purpose.

Detection of Arbitrary-Feature Waveform:

While the random event interception gain, as described above, was demonstrated for a transform-limited pulse, the same SNR enhancement can be achieved for pulses with unknown spectral phase profile. Specifically, for a short-time arbitrary (bursty) event, a similar spectral processing technique over a sub-band window can be applied. While a complex event that has a temporal sub-structure does not necessarily fit the original motivation of this research (to detect random, singularly-occurring pulses), we show that the new receiver can also intercept such waveforms.

The spectral decomposition and coherent summation can be achieved across partial bandwidth (i.e., over spectral range that is smaller than the full bandwidth of the event), resulting in a similar noise discrimination effect, regardless of the underlying (complex) phase profile (chirp). This is equivalent to applying the new detection to the envelope of the isolated burst, to achieve detectability comparable to that of the transform-limited detection described above. To guarantee that the partial bandwidth of the event correctly corresponds to the envelope of the structured event in cases when there is bipolarity (sign change) during the event, a rectification step is required prior to imposing band limitation and subsequent summation. This is trivially accomplished by a biased Mach-Zehnder modulator that leads to electrical-to-rectified-optical-field conversion as described below.

Figure 8:
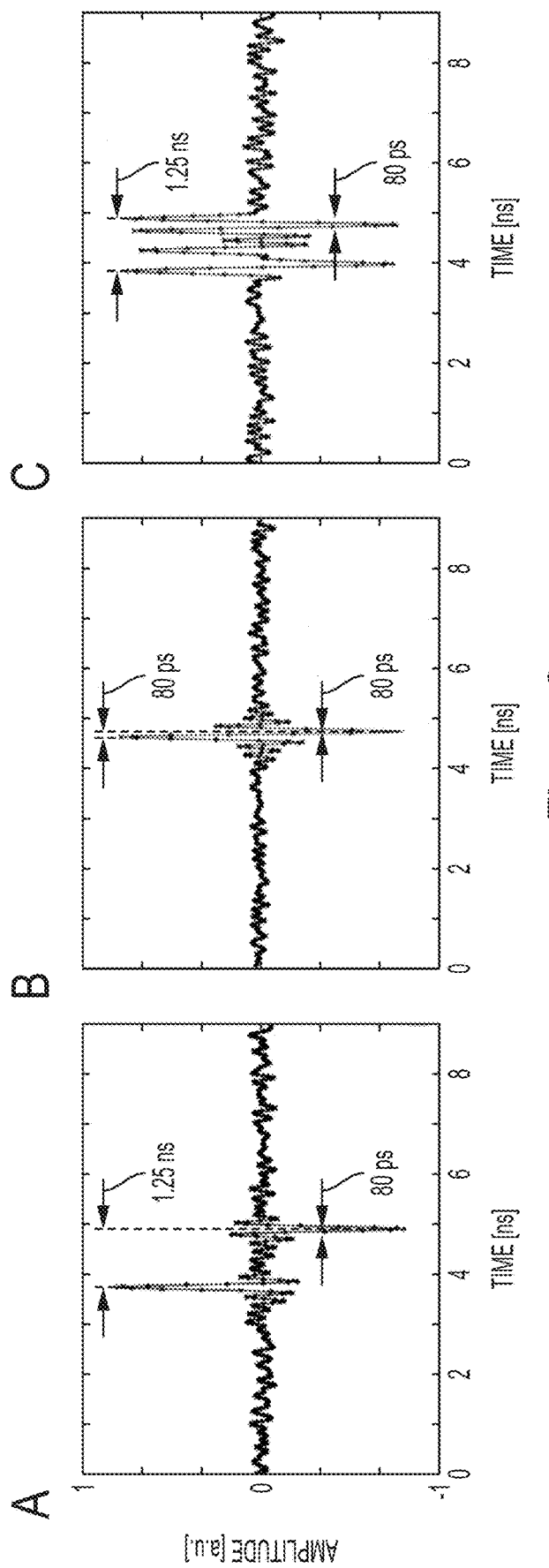
FIG. 8 shows structured-event input test signals; (a) doublet pulse with $1/\delta f=1.25$ ns separation, (b) a doublet pulse with $1/\delta f=80$ ps separation, and (c) bipolar pulses randomly positioned in $1/\delta f=1.25$ ns interval. ($\Delta f=12$ GHz corresponds to fastest transition within the event; $\delta f=800$ MHz is the envelope bandwidth of the event).
Figure 9:
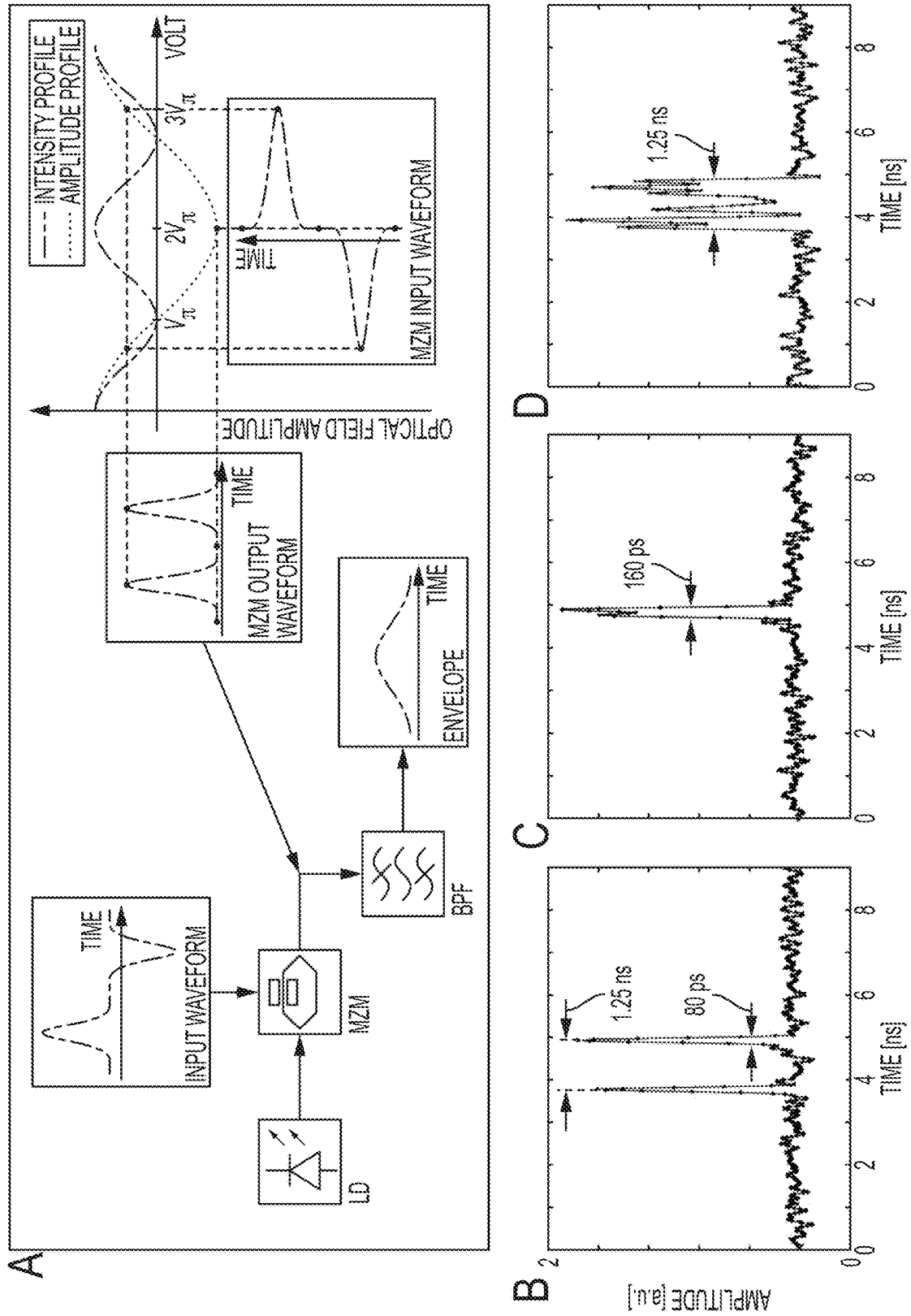
FIG. 9 shows electro-optical rectification; (a) electrical signal to rectified optical conversion using Mach-Zehnder modulator biased at its maximal point; measured rectified optical field of b) doublet pulse with 1.25 ns separation, (c) doublet pulse with 80 ps separation, (d) bipolar pulses randomly positioned in 1.25 ns interval.
Figure 10:
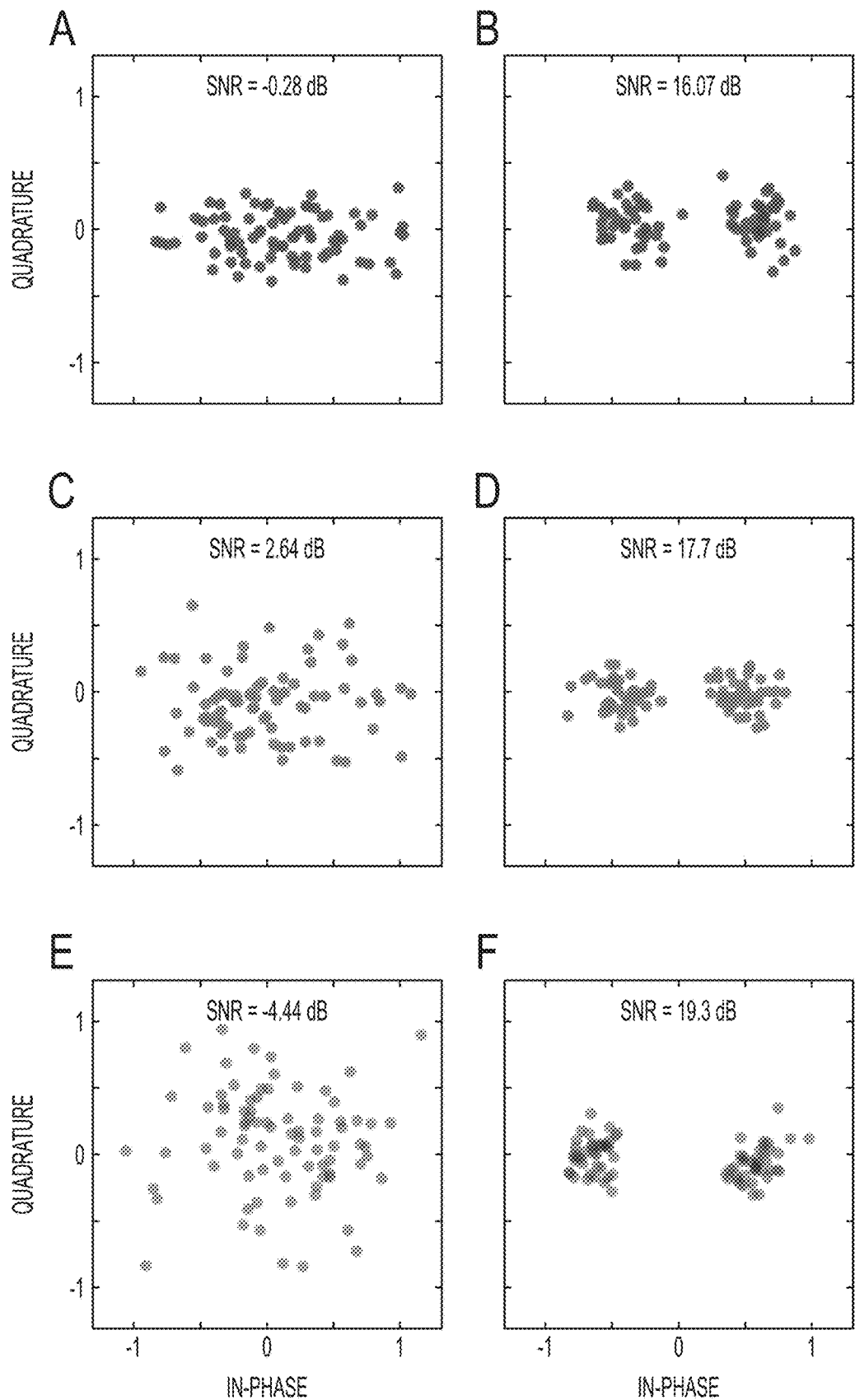
FIG. 10 shows structured-event detection gain, including a doublet pulse with 1.25 ns separation in (a) conventional and (b) spectral-cloning receiver; doublet pulse with 80 ps separation in (c) conventional and (d) spectral-cloning receiver; and bipolar pulses randomly positioned in 1.25 ns interval in (e) conventional and (f) spectral-cloning receiver.

The capability of the spectral cloning receiver to intercept an arbitrarily shaped signal has been verified for three different signal classes. These are illustrated in FIG. 8 and consisted of a pulse doublet separated by $1/\delta f$, a pulse doublet with $1/\Delta f$ separation, and a set of bipolar pulses randomly positioned within $1/\delta f$ interval, where $\Delta f=12$ GHz corresponds to the fastest transition in the event, while $\Delta f=800$ MHz is the event's envelope bandwidth. A Mach-Zehnder modulator (MZM) biased at its maximum characteristic function was used to rectify the test signals and subsequently imprint them onto the optical frequency comb. FIG. 9 shows the electro-optical rectification and the corresponding rectified optical signal measured at MZM output. The optical frequency comb, used in this experiment, consisted of 40 tones separated by 25 GHz. The local oscillator comb shared the same master oscillator and generated 40 tones with 25.02 GHz spacing. In this case, the spectral cloning receiver decomposes the spectral width corresponding to the event's envelope (i.e., $\delta f=800$ MHz) into 40 spectral bins and then coherently sums spectral bins to increase the intercept probability. Since the spectral processing bandwidth ($\delta f$) remains smaller than the feature bandwidth ($\Delta f$) of the structured burst, the spectral phase across decomposed frequency bins will be aligned, resulting in an SNR increase. FIG. 10 shows the scatter plots before and after spectral processing for three input signal classes. The measurement clearly indicates that the expected detection SNR gain (i.e., ~10 Log(40)=16 dB) for arbitrary-featured events can be still obtained by the spectrally cloning detector.

Accordingly, in general, a method according to the present invention is a method for analyzing and detecting random, single-occurrence signals that occur at unpredictable intervals in a relatively noisy environment by replicating a single event to frequency non-degenerate copies (spectral clones) in a nearly noiseless manner. Typically, an estimate of the single-occurrence signal is reached by coherent summation. Typically, a signal is distinguished from noise by determining that the noise does not have a deterministic relation. The signal can be associated with a sub-nanosecond event. Typically, sensitivity increases with spectral clone count, and a number of possible spectral clone counts, including, but not limited to, spectral clone counts of 6, 12, 24, or 36, can be used. In practice, the spectral clone count is defined by the number of frequency comb tones used in the receiver and the bandwidth of the subrate receiver element. Present frequency combs provide tone count in excess of 1000, enabling spectral count to reach at least 1000 copies. In one alternative, spectral decomposition and coherent summation can be achieved across partial bandwidth. When spectral decomposition and coherent summation is achieved across partial bandwidth, typically, a rectification step is employed prior to imposing band limitation and subsequent summation. Typically, the rectification step is performed by use of an optical modulator, such as a biased Mach-Zehnder modulator, that leads to electrical-to-rectified-optical-field conversion.

In a method according to the present invention, the signal can be selected from a signal generated in astronomy, a signal generated in spectroscopy, a signal generated in biology, a signal generated in communication, and a signal generated in remote sensing. However, signals from other sources that are of low or variable amplitude and that arise in a noisy environment can be detected and analyzed by methods according to the present invention. When the signal is a signal generated in biology, the signal can be associated with a subcellular process. The subcellular process can be a process such as metabolism, apoptosis, or cell division. Typically, the confidence level of the detection and analysis exceeds 50%. The confidence level of the detection and analysis can exceed 99%. In one alternative of a method according to this invention, a signal discrete Fourier transform is obtained in a computation-free manner.

In one alternative, the replication is performed to enable cyclostationary detection of the noisy signal. Typically, in this alternative, the method employs a set of lossless narrow filters with bandwidth of can be constructed over the full span of a $\Delta f$-wide signal and the spectral decomposition of a received field is analyzed by short-time Fourier transform to generate a phasor sum, wherein the differential phasor rotation is stopped by frequency shifting each output to the baseband. Typically, when such a set of lossless narrow filters is used, the spectral decomposition process is distortionless and lossless.

When the signal is associated with a sub-nanosecond event, typically, the received signal is mapped onto widely separated frequency carriers and then spectral decomposition is performed by a strictly periodic bandpass process. In this alternative, typically, analysis occurs in the optical domain, and typically, the received signal is in a microwave spectral range of from about 0.3 GHz to about 100 GHz. In this alternative, the received field is mapped onto a highly-coherent frequency comb. The frequency comb is typically tunable. In this alternative, typically, the detector bandwidth and the comb frequency offset are matched, and two wavelength demultiplexing elements (WDM) are used to route the spectrally overlapping copy and a local oscillator (LO) mode to two coherent detectors. Typically, in this alternative, the output of each detector D is sampled and used to perform coherent summation to discriminate the pulse from the noise. In this alternative, the tunable optical frequency comb can be generated by a method selected from the group consisting of use of mode locking lasers, cascaded four wave mixing (FWM) processes in a micro resonator cavity, and an optical cavity-less technique relying on optical pulses defined by a tunable microwave oscillation. Typically, in this alternative, phase locking between corresponding spectral lines of two combs is achieved by using a single frequency-stabilized master laser that seeds both tunable optical combs (TOCs) and phase locking.

REFERENCES

The following references are described by reference number in the text. These references are not necessarily prior art and their inclusion does not constitute an admission by Applicants that these references are prior art.

1. J. R. Lakowicz, *Principles of Fluorescence Spectroscopy* (Springer, New York, 2006).
2. D. Thornton et al., A population of fast radio bursts at cosmological distances. *Science* 341, 53-56 (2013).
3. G. J. Pendock, D. D. Sampson, Increasing the transmission capacity of coherence multiplexed communication system by using differential detection, *IEEE Photon. Technol. Lett.* 7, 1504-1506 (1995).
4. R. N. McDonough, A. D. Whalen, *Detection of Signals in Noise* (Academic Press, 1995).
5. W. A. Gardner, A. Napolitano, L. Paura, Cyclostationarity: half century of research, *Signal Process.* 86, 639-697 (2006).
6. A. Jolly, J. F. Gleyze, J. C. Jolly, Static and synchronized switching noise management of replicated optical pulse trains, *Opt. Commun.* 264, 89-96 (2006).
7. W. R. Donaldson, J. R. Marciante, R. G. Roides, An optical replicator for single-shot measurements at 10 GHz with a dynamic range of 1800:1, *IEEE J. Quantum Electron.* 46, 191-196 (2010).
8. Z. Tong, S. Radic, Low-noise optical amplification and signal processing in parametric devices, *Adv. Opt. Photonics* 5, 318-384 (2013).
9. J. B. Allen, Short term spectral analysis, synthesis and modification by discrete Fourier transform, *IEEE Trans. Acoust. Speech Signal Process.* 25, 589-589 (1977).
10. Y. Rozanov, Probability Theory, *Random Processes and Mathematical Statistics* (Springer, New York, 1995).
11. R. H. Walden, Analog-to-digital converter survey and analysis, *IEEE J. Sel. Areas Commun.* 17, 539-550 (1999).
12. B. Murmann, *ADC Performance Survey* 1997-2015. http://web.stanford.edu/~murmann/adcsurvey.html (2015).
13. G. W. Anderson, D. C. Webb, A. E. Spezio, J. N. Lee, Advanced channelization technology for RF, microwave and millimeter wave applications, *Proc. IEEE* 79, 355-388 (1991).
14. C.-S. Bres, A. O. J. Wiberg, S. Zlatanovic, S. Radic, Performance of instantaneous microwave analysis by parametric channelized receiver through time domain monitoring, *J. Lightwave Technol.* 30, 3192-3198 (2012).
15. M. E. Marhic, *Optical Parametric Amplifiers, Oscillators and Related Devices* (Cambridge University Press, 2008).
16. Z. Tong, et al., Towards ultrasensitive optical links enabled by low-noise phase-sensitive amplifiers, *Nature Photon.* 5, 430-436 (2011).
17. J. D. Taylor, *Ultra wideband Radar: Applications and Design* (CRC Press, 2012).
18. C. Weitkamp, *Lidar: Range-Resolved Optical Remote Sensing of the Atmosphere* (Springer, New York 2014).
19. E. Myslivets, B. P.-P. Kuo, N. Alic, S. Radic, Generation of wideband frequency combs by continuous-wave seeding of multistage mixers with synthesized dispersion, *Opt. Express* 20, 3331-3344 (2012).
20. V. Ataie, E. Myslivets, B. P.-P. Kuo, N. Alic, S. Radic, Spectrally equalized frequency comb generation in multistage parametric mixer with nonlinear pulse shaping, *J. of Lightwave Technol.* 32, 840-846 (2014).
21. Material and methods are available as supplementary materials on Science Online.
22. G. Jacobsen, *Noise in Digital Optical Transmission Systems* (Artech House, Boston, 1994).

23. H. A. Haus, E. P. Ippen, K. Tamura, Additive-pulse modelocking in fiber lasers. Recent developments in compact ultrafast lasers, *IEEE J. Quantum Electron.* 30, 200-208 (1994).
24. S. Namiki, C. X. Yu, H. A. Haus, Observation of nearly quantum-limited timing jitter in an all-fiber ring laser, *J. Opt. Soc. Amer. B* 13, 2817-2823 (1996).
25. Y. K. Chembo, N. Yu, Modal expansion approach to optical-frequency-comb generation with monolithic whispering-gallery-mode resonators, *Phys. Rev. A* 82, 033801 (2010).
26. S. Coen, M. Erkintalo, Universal scaling laws of Kerr frequency combs, *Opt. Lett., vol.* 38, no. 11, pp. 1790-1792, (2013).
27. V. Ataie, et. al., Ultrahigh count coherent WDM channels transmission using optical parametric comb based frequency synthesizer. *J. Lightwave Technol.* 33, 694-699 (2015).
28. F. Herzog, K. Kudielka, D. Erni, W. Bachtold, Optical phase locking by local oscillator phase dithering. *IEEE J. Quantum Electron.* 42, 973-985 (2006).
29. Ma, Y. et al. Coherent beam combination with single frequency dithering technique. *Opt. Lett.* 35, 1308-1310 (2010).

ADVANTAGES OF THE INVENTION

The present invention provides an improved method for detecting and analyzing random, sparsely occurring signals that occur at unpredictable intervals in a relatively noisy environment. Methods according to the present invention have application in areas such as astronomy, spectroscopy, communication, biology, and remote sensing. Observation of random, non-repetitive phenomena is of critical importance in astronomy, spectroscopy, communication, biology and remote sensing, as well as other areas. Heralded by weak signals, hidden in noise, they pose basic detection challenges. In contrast to repetitive waveforms, a single-instance signal cannot be separated from noise by averaging. The present invention demonstrates that a fast, randomly occurring event can be detected and extracted from a noisy background without conventional averaging. An isolated 80-ps pulse was received with confidence level exceeding 99%, even when accompanied by noise. The detector employed in the present invention relies on instantaneous spectral cloning and a single-step, coherent field processor. The ability to extract fast, sub-noise events is expected to increase detection sensitivity in multiple disciplines. Additionally, the new spectral-cloning receiver can potentially intercept communication signals that are presently considered secure.

Methods according to the present invention possess industrial applicability for detection of such random, single-occurrence signals in such fields as astronomy, spectroscopy, biology, communication, and remote sensing.

The method claims of the present invention provide specific method steps that are more than general applications of laws of nature and require that those practicing the method steps employ steps other than those conventionally known in the art, in addition to the specific applications of laws of nature recited or implied in the claims, and thus confine the scope of the claims to the specific applications recited therein. These method claims do not preempt the use of an algorithm and describe physical transformations of the signals involved. These physical transformations and the hardware and software required to produce and analyze them are distinct from any algorithms.

The inventions illustratively described herein can suitably be practiced in the absence of any element or elements, limitation or limitations, not specifically disclosed herein. Thus, for example, the terms "comprising," "including," "containing," or other similar terminology, shall be read expansively and without limitation. Additionally, the terms and expressions employed herein have been used as terms of description and not of limitation, and there is no intention in the use of such terms and expressions of excluding any equivalents of the future shown and described or any portion thereof, and it is recognized that various modifications are possible within the scope of the invention claimed. Thus, it should be understood that although the present invention has been specifically disclosed by preferred embodiments and optional features, modification and variation of the inventions herein disclosed can be resorted by those skilled in the art, and that such modifications and variations are considered to be within the scope of the inventions disclosed herein. The inventions have been described broadly and generically herein. Each of the narrower species and subgeneric groupings falling within the scope of the generic disclosure also form part of these inventions. This includes the generic description of each invention with a proviso or negative limitation removing any subject matter from the genus, regardless of whether or not the excised materials specifically resided therein.

In addition, where features or aspects of an invention are described in terms of the Markush group, those schooled in the art will recognize that the invention is also thereby described in terms of any individual member or subgroup of members of the Markush group. It is also to be understood that the above description is intended to be illustrative and not restrictive. Many embodiments will be apparent to those of in the art upon reviewing the above description. The scope of the invention should therefore, be determined not with reference to the above description, but should instead be determined with reference to the appended claims, along with the full scope of equivalents to which such claims are entitled. The disclosures of all articles and references, including patents and patent publications, are incorporated herein by reference.

What is claimed is:

1. A method for analyzing and detecting sparse signals occurring at random intervals in an environment comprising noise, by replicating a single event to frequency non-degenerate copies (spectral clones) in a noiseless manner, wherein the replicating is performed to enable cyclostationary detection of the noisy signal.

2. The method of claim 1 wherein an estimate of the sparsely occurring signal is reached by coherent summation.

3. The method of claim 1 wherein a signal is distinguished from noise by determining that the noise does not have a deterministic relation.

4. The method of claim 1 wherein the method employs set of lossless narrow filters with bandwidth $\delta f$ can be constructed over a full span of a $\Delta f$-wide signal and a spectral decomposition of a received field is analyzed by short-time Fourier transform to generate a phasor sum, wherein the differential phasor rotation is stopped by frequency shifting each output to a baseband.

5. The method of claim 4 wherein the spectral decomposition is distortionless and lossless.

6. The method of claim 1 wherein the signal is associated with a sub-nanosecond event.

7. The method of claim 6 wherein the signal is mapped onto widely separated frequency carriers and then spectral decomposition is performed by a strictly periodic bandpass process.

8. The method of claim 7 where analysis occurs in an optical domain.

9. The method of claim 7 wherein the received signal is in a microwave spectral range of from 0.3 GHz to 100 GHz.

10. The method of claim 9 wherein the received field is mapped onto a highly-coherent frequency comb.

11. The method of claim 10 wherein the frequency comb is tunable.

12. The method of claim 11 wherein a detector bandwidth and a comb frequency offset are matched.

13. The method of claim 12 wherein two wavelength demultiplexing elements (WDM) are used to route the spectrally overlapping copy and a local oscillator (LO) mode to two coherent detectors.

14. The method of claim 13 wherein an output of each detector D is sampled and used to perform coherent summation to discriminate a pulse from the noise.

15. The method of claim 1 wherein sensitivity increases with spectral clone count.

16. The method of claim 11 wherein a tunable optical frequency comb is generated by a method selected from a group consisting of use of mode locking lasers, cascaded four wave mixing (FWM) processes in a micro resonator cavity, and an optical cavity-less technique relying on optical pulses defined by a tunable microwave oscillation.

17. The method of claim 11 wherein phase locking is between corresponding spectral lines of two combs is achieved by using a single frequency-stabilized master laser that seeds both tunable optical combs (TOCs) and phase locking.

18. The method of claim 1 wherein a cloning count is a cloning count up to 1000.

19. The method of claim 18 wherein the cloning count selected from a group consisting of 6, 12, 24, and 36 is employed.

20. The method of claim 1 wherein spectral decomposition and coherent summation is achieved across partial bandwidth.

21. The method of claim 20 wherein a rectification step is employed prior to imposing band limitation and subsequent summation.

22. The method of claim 20 wherein the rectification step is performed by use of an optical modulator that leads to electrical-to-rectified-optical-field conversion.

23. The method of claim 22 wherein the optical modulator is a biased Mach-Zender modulator.

24. The method of claim 1 wherein the signal is selected from a signal generated in astronomy, a signal generated in spectroscopy, a signal generated in communication, a signal generated in biology, and a signal generated in remote sensing.

25. The method of claim 24 wherein the signal is a signal generated in biology and the signal is associated with a subcellular process.

26. The method of claim 25 wherein the subcellular process is a process selected from a group consisting of metabolism, apoptosis, and cell division.

27. The method of claim 1 wherein a confidence level of the detection and analysis exceeds 50%.

28. The method of claim 27 wherein the confidence level of the detection and analysis exceeds 99%.

29. The method of claim 1 further comprising: obtaining a signal discrete Fourier transform.

* * * * *